(12) United States Patent
Elg (10) Patent No.: US 6,952,351 B1
(45) Date of Patent: Oct. 4, 2005

(54) SYSTEMS AND METHODS FOR INSTALLING A CIRCUIT BOARD ASSEMBLY UTILIZING AN INSERTION DELAY LATCH

(75) Inventor: Cedric Elg, Gilroy, CA (US)

(73) Assignee: Cisco Technology, Inc., San Jose, CA (US)

( * ) Notice: Subject to any disclaimer, the term of this patent is extended or adjusted under 35 U.S.C. 154(b) by 286 days.

(21) Appl. No.: 10/341,798

(22) Filed: Jan. 14, 2003

(51) Int. Cl.[7] ............................................. H05K 5/00
(52) U.S. Cl. ...................... 361/752; 361/801; 361/753; 361/686; 439/327
(58) Field of Search ................... 361/801, 800, 361/752, 797, 798, 759, 740, 732, 747, 754; 211/41.17

(56) References Cited

U.S. PATENT DOCUMENTS

| | | | |
|---|---|---|---|
| 4,547,835 A | 10/1985 | Pansaerts et al. ........... 361/399 |
| 5,268,592 A | 12/1993 | Bellamy et al. .............. 307/43 |
| 5,321,962 A | 6/1994 | Ferchau et al. ............... 70/208 |
| 5,432,916 A | 7/1995 | Hahn et al. .................. 710/302 |
| 5,434,752 A * | 7/1995 | Huth et al. .................. 361/798 |
| 6,185,106 B1 | 2/2001 | Mueller ....................... 361/798 |
| 6,395,976 B1 * | 5/2002 | Koradia et al. ......... 174/35 GC |

* cited by examiner

*Primary Examiner*—Kamand Cuneo
*Assistant Examiner*—Hung S. Bui
(74) *Attorney, Agent, or Firm*—David E. Huang, Esq.

(57) ABSTRACT

An insertion delay subassembly includes a support member which is configured to mount to the circuit board, and a lever coupled to the support member. The lever is configured to reside in a first orientation relative to the support member when the circuit board initially engages with a card cage, and pivot from the first orientation to a second orientation relative to the support member when the circuit board subsequently installs fully within the card cage. The insertion delay subassembly further includes an insertion delay latch coupled to one of the support member and the lever. The insertion delay latch is configured to selectively (i) block movement of the lever from the first orientation to the second orientation, and (ii) enable movement of the lever from the first orientation to the second orientation.

22 Claims, 9 Drawing Sheets

SYSTEMS AND METHODS FOR INSTALLING A CIRCUIT BOARD ASSEMBLY UTILIZING AN INSERTION DELAY LATCH

BACKGROUND OF THE INVENTION

A typical circuit board system includes an interconnection subsystem and a set of circuit board assemblies. The interconnection subsystem typically includes a card cage, and a backplane mounted to the card cage. Each circuit board assembly installs into a cavity of the card cage and electrically connects to the backplane.

In general, each circuit board assembly includes a circuit board, a row of circuit board connectors disposed along an inner edge of the circuit board and a set of levers disposed along an outer edge of the circuit board. To install a circuit board assembly into the interconnection subsystem, a user (i) orients the levers of the circuit board assembly so that they substantially extend from the outer edge of the circuit board, and (ii) slides the circuit board assembly through an opening of the card cage (inner edge first) so that the row of circuit board connectors along the inner edge of the circuit board moves toward a corresponding row of backplane connectors on the backplane. The circuit board continues to pass through the card cage opening until the levers along the outer edge of the circuit board contact the card cage adjacent the card cage opening. At this point, the levers partially rotate in response to contact with the card cage, and the circuit board connectors of the circuit board align with and partially engage the backplane connectors. The user completes installation of the circuit board assembly by manually continuing to rotate the levers from their partially rotated positions into fully collapsed positions against the outer edge of the circuit board. As the user rotates the levers to their fully collapsed positions, ends of the levers grab the card cage near the card cage opening to leverage the circuit board assembly further toward the backplane thus generating a proper amount of insertion force to push the circuit board connectors into fully mated positions with the backplane connectors. A similar circuit board assembly is disclosed in U.S. Pat. No. 6,185,106, which is entitled "PRINTED CIRCUIT BOARD EXTRACTOR TOOL OPERATED LATCH" and which is assigned to the same Assignee as the present invention, the teachings of which are hereby incorporated by reference in their entirety.

One type of circuit board assembly includes a circuit board having circuitry which is configured to connect with the backplane while the backplane is powered-up or in a "hot" state. That is, a user is capable of installing that circuit board assembly into an empty slot of the card cage while the backplane conveys signals to other circuit board assemblies already installed within the card cage. During installation, when the circuit board connectors make electrical contact with the backplane connectors, the circuitry of the circuit board assembly (i) receives the signals, (ii) performs a power up sequence, and (iii) begins operation.

Such a circuit board assembly is well-suited for fault-tolerant situations in which a redundant but failed circuit board assembly is replaced in a "hot swapping" manner. In such a situation, the user does not power down the entire system. Rather, the user simply removes the failed circuit board assembly and installs a new circuit board assembly while the backplane continues to deliver signals to the remaining installed circuit board assemblies. Accordingly, the system as a whole continues operation in a fault tolerant manner during the replacement process.

One conventional circuit board assembly includes circuitry that requires (i) receipt of only power signals, then (ii) a time delay while the circuitry performs a power-up sequence, and finally (iii) other signals in order to function properly. The circuitry must receive the power and the other signals in this staggered fashion in order to avoid damage and to operate properly. If the circuitry initially receives the power signals and the control signals simultaneously, damage to the circuitry will occur and the damaged circuit board assembly will require replacement.

To avoid damage to such a circuit board assembly, the manufacturer of the circuit board assembly typically warns the user to install the circuit board assembly in a staggered manner when the backplane is in the powered-up "hot" state. To this end, the manufacturer directs the user to (i) partially insert the circuit board assembly into the interconnection subsystem such that longer power supply pins of the connectors connect first, then (ii) wait a short period of time (e.g., at least one or two seconds) so that the circuitry reaches a stable and controlled state, and subsequently (iii) fully insert the circuit board assembly into the interconnection subsystem such that the remaining shorter connector pins of the connectors properly connect. Accordingly, during a "hot swap" installation of the circuit board assembly, the circuitry of the circuit board assembly receives the power signals first, then performs a power-up sequence (e.g., power sequencing operations) without receiving any other signals, and finally receives the other signals in order to properly begin operation.

SUMMARY

Unfortunately, there are deficiencies to the above-identified conventional approaches to installing a circuit board assembly within an interconnection subsystem. For example, the user may attempt to install the circuit board assembly too quickly without allowing the circuit board assembly to properly seat within the card cage. In particular, the user may push the circuit board assembly in a rough or thrusting manner even though the circuit board is not properly nestled within its slot of the card cage. In such a situations, the circuit board connectors will not be properly aligned with the backplane connectors. Thus, as the user continues to apply force on the circuit board assembly (e.g., by operating the levers), one or more components may sustain damage due to the misalignment. For example, the user may bend one or more connector pins, the user may overstress the circuit board or a connector, the user may fracture one or more solder joints, etc. Such damage is particularly likely when the circuit board assembly and/or the interconnection subsystem suffers from a buildup of worst case mechanical tolerances.

Additionally, even though a manufacturer may require a user to "hot swap" install a circuit board assembly within the interconnection subsystem in a staggered manner to avoid damaging circuits, it is relatively easy for the user to install the circuit board assembly too quickly. That is, since the levers of the circuit board assembly are capable of partially rotating in response to contact with the card cage, it is possible for the user to over-install the circuit board assembly into the card cage in a single, continuous motion (e.g., with a strong push) and thus not wait long enough for the power-up sequence to complete (i.e., and thus not provide enough time for the circuitry to reach a stable and controlled state before receiving signals other than the power signals). Such a scenario is particularly likely if the user is not well-trained or if the user is unaware of the manufacturer's requirement for installation to occur in a staggered manner.

Furthermore, even if the user is well-trained, it is still possible for the user to accidentally over insert the circuit board assembly causing the circuit board assembly to receive control signals too soon. For example, it may be difficult for the user to judge the proper amount of force and distance to push the circuit board assembly due to tolerance differences in the circuit board assembly and/or the interconnection subsystem and move the circuit board assembly too far forward so that the power signal pins and the control signal pins connect concurrently. Additionally, the user may misjudge the amount of time that passes before completing the installation and complete the installation before the power-up sequence is finished. As a result, regardless of whether the user is well-trained or not, it is very easy for the user to install the circuit board assembly too quickly and thus damage the circuit board assembly.

The invention is directed to circuit board installation techniques which utilize an insertion delay latch. The use of such a latch enables a user to install a circuit board assembly in a simple and easy staggered manner for consistency and reliability. Accordingly, the insertion delay latch provides time for proper component alignment, and is well-suited for use in "hot swapping" situations that require or prefer that a first set of connector contacts electrically to connect before a second set of connector contacts.

One embodiment of the invention is directed to an insertion delay subassembly for a circuit board. The insertion delay subassembly includes a support member which is configured to mount to the circuit board (e.g., an elongated rigid member which is configured to fasten to an edge of the circuit board), and a lever coupled to the support member. The lever is configured to reside in a first orientation relative to the support member when the circuit board initially engages with a card cage, and pivot from the first orientation to a second orientation relative to the support member when the circuit board subsequently installs fully within the card cage. The insertion delay subassembly further includes an insertion delay latch coupled to one of the support member and the lever. The insertion delay latch is configured to selectively (i) block movement of the lever from the first orientation to the second orientation, and (ii) enable movement of the lever from the first orientation to the second orientation. Due to the operation of the insertion delay latch, the installation process tends to be slightly slower and smoother thus providing time for connectors to properly align and, if a time delay is needed, time for a power-up sequence to complete before completing installation.

In one arrangement, the insertion delay latch pivotally couples to the lever. In this arrangement, the insertion delay latch is configured to (i) interfere with a portion of the support member when the insertion delay latch resides at a first angle relative to the lever to block movement of the lever from the first orientation to the second orientation, and (ii) clear the portion of the support member when the insertion delay latch resides at a second angle relative to the lever to enable movement of the lever from the first orientation to the second orientation. Accordingly, the user is capable of actuating the insertion delay latch from an interference position to a clearance position by simply pivoting the insertion delay latch from the first angle to the second angle relative to the lever.

In one arrangement, the insertion delay latch is configured to reside (i) at the first angle relative to the lever in response to gravitational force on the insertion delay latch, and (ii) at the second angle relative to the lever in response to a force that overcomes the gravitational force on the insertion delay latch. This arrangement is well-suited for applications in which the insertion delay latch pivots within a substantially vertical plane. That is, gravitational force properly biases the insertion delay latch toward the first angle relative to the lever thus alleviating the need for another biasing mechanism.

In another arrangement, the insertion delay subassembly further includes a spring (e.g., a leaf spring) disposed between the lever and the insertion delay latch. The spring provides a force that biases the insertion delay latch at the first angle relative to the lever. This arrangement is well-suited for applications in which there is no control over the orientation of the insertion delay latch (e.g., there is no guarantee that the insertion delay latch will pivot within a substantially vertical plane). For example, even when the insertion delay latch pivots in a substantially horizontal plane, the insertion delay latch is properly biased toward the first angle by the spring.

The features of the invention, as described above, may be employed in interconnection systems, devices and methods as well as other circuit board related mechanisms such as those of Cisco Systems, Inc. of San Jose, Calif.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

The invention is directed to circuit board installation techniques which utilize an insertion delay latch. Use of the insertion delay latch enables a user to connect a circuit board to another structure (e.g., a backplane) in a staggered, but simple and deliberate manner. Accordingly, the insertion delay latch provides time for proper component alignment, and is well-suited for use in "hot swapping" situations that require or prefer that a first set of connector contacts to electrically connect (e.g., primary power signal pins for proper power sequencing) before a second set of connector contacts (e.g., non-primary power signal pins).

Figure 1:
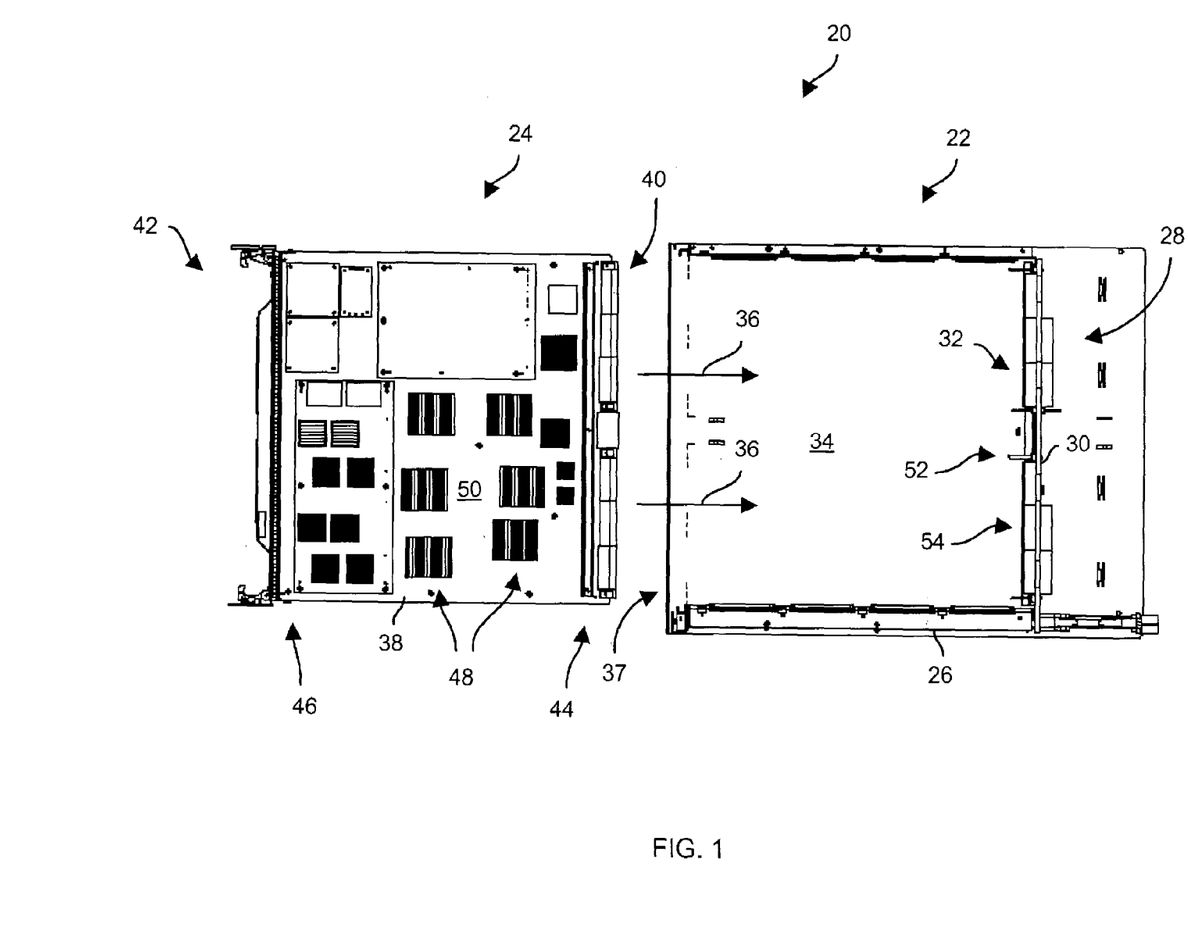
FIG. 1 is a side view of a connection system which is suitable for use by the invention.

FIG. 1 shows a connection system 20 which is suitable for use by the invention. The connection system 20 includes an interconnection subsystem 22 and a set of circuit board assemblies 24. The interconnection subsystem 22 includes a card cage 26 and a backplane 28. The backplane 28 includes a rigid circuit board structure 30 (e.g., layers of conductive and non-conductive material sandwiched together to provide signal traces) which is mounted to the card cage 26, and a set of backplane connectors 32 mounted to the circuit board structure 30. The rigid circuit board structure 30 holds the backplane connectors 32 in fixed positions relative to the card cage 26. In particular, the rigid circuit board structure 30 positions the backplane connectors 32 in rows within a cavity 34 of the card cage 26 thus requiring the circuit board assemblies 24 to install within slots of the card cage 26 in a direction 36 through an opening 37 of the card cage 26 in order to connect with the backplane 28.

The circuit board assembly 24 includes a circuit board 38, a set of circuit board connectors 40 and an insertion delay subassembly 42. The circuit board connectors 40 are disposed in a row along an inner edge 44 of the circuit board 38. The insertion delay subassembly 42 is disposed along an outer edge 46 of the circuit board 38 which is opposite the inner edge 44. In one arrangement, the insertion delay subassembly 42 is an elongated rigid member (e.g., a strap or bar-shaped member) which is configured to fasten to the circuit board 38 using hardware (e.g., nuts and bolts through holes in the circuit board 38).

It should be understood that FIG. 1 shows a cross-sectional side view of the interconnection subsystem 22 in order to better illustrate particular internal details of the interconnection subsystem 22. Accordingly, only one row of backplane connectors 32 and one circuit board assembly 24 is visible in FIG. 1. Nevertheless, it should be understood that the interconnection subsystem 22 is configured to receive multiple circuit board assemblies 24 in a substantially parallel manner, i.e., the card cage 26 defines multiple slots and the backplane 28 includes multiple corresponding rows of backplane connectors 32 to connect the multiple circuit board assemblies 24 together.

As shown in FIG. 1, the circuit board 38 has a set of circuit board components 48 mounted thereon (e.g., ICs, individual capacitors, resistors, diodes, etc.). By way of example only, circuitry 50 formed by the circuit board components 48 requires a time delay between receiving power signals and control signals. Accordingly, if a user attempts to install the circuit board assembly 24 into the interconnection subsystem 22 while the backplane 28 is "hot", the user must install the circuit board assembly 24 in a staggered manner. In particular, the user must first connect the circuitry 50 of the circuit board assembly 24 to power signal contacts, wait a particular amount of time (e.g., one second), and then connect the circuitry 50 of the circuit board assembly 24 to remaining contacts (e.g., contacts carrying control signals, data, etc.). Otherwise, the circuitry 50 will be damaged or operate improperly.

To facilitate a "hot" installation, the backplane connectors 32 include sets of pins of different length so that particular electrical connections are established before others. By way of example only, the backplane connectors 32 include primary power signal pins 52 (e.g., 48 Volt pre-power pins) and other signal pins 54 (e.g., other power signal pins, control signal pins, data pins, etc.). The primary power signal pins 52 are longer than and extend into the card cage cavity 34 further than the other signal pins 54. Also, by way of example only, the primary power signal pins 52 are distributed (e.g., relatively evenly) among the connectors 32 of the interconnection subsystem 22. As will be explained in further detail later, the different lengths of the pins 52, 54 enable the circuitry 50 to receive primary power signals and, after a short delay, to receive other signals (e.g., control signals, data signals, etc.). Accordingly, the circuitry 50 is capable of experiencing a time delay between receiving the primary power signals and the other signals as required in the example above. Further details of the invention will now be provided with reference to FIG. 2.

Figure 2:
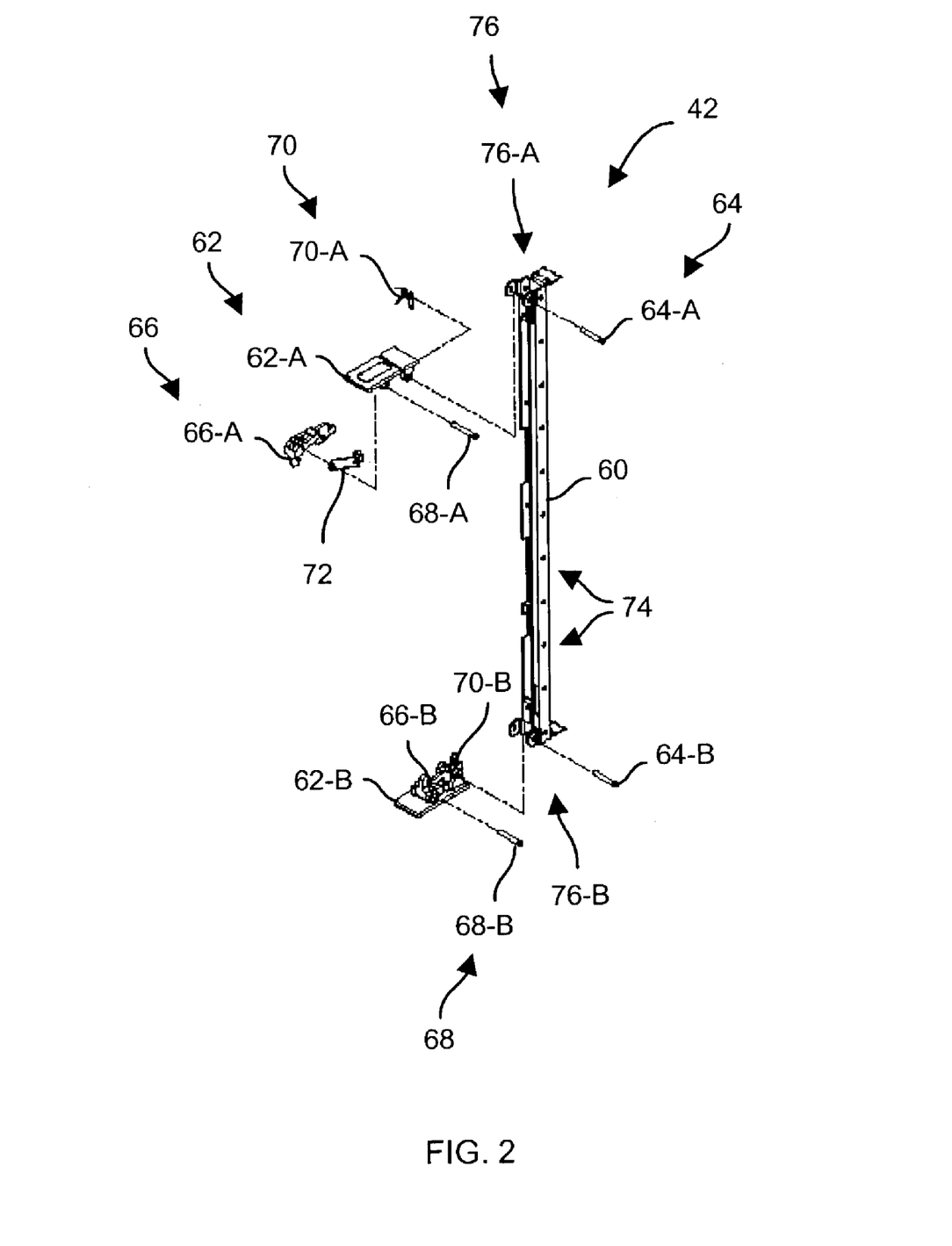
FIG. 2 is an exploded view of an insertion delay subassembly of the connection system of FIG. 1.

FIG. 2 shows a partially exploded view of the insertion delay subassembly 42. As shown, the insertion delay subassembly 42 includes a support member 60 which is configured to mount to the circuit board 38, a set of levers 62-A, 62-B (collectively, levers 62), a set of lever hinges 64-A, 64-B (collectively, lever hinges 64), a set of lever latches 66-A, 66-B (collectively, lever latches 66), a set of latch hinges 68-A, 68-B (collectively, latch hinges 68), a set of lever springs 70-A, 70-B and an insertion delay latch 72. For illustration purposes, the lever 62-A, the lever hinge 64-A, the lever latch 66-A, the latch hinge 68-A, the lever spring 70-A and the insertion delay latch 72 are shown in a disassembled state. In contrast, the lever 62-B, the lever hinge 64-B, the lever latch 66-B, the latch hinge 68-B and the lever spring 70-B are shown in an assembled state. In one arrangement, the support member 60 is an elongated rigid frame (e.g., metal, plastic, etc.) that defines holes 74 to enable the support member 60 to fasten to the circuit board 38 using hardware (e.g., screws, nuts and bolts, etc.).

When the insert delay subassembly 42 is fully assembled, the lever hinge 64-A pivotally couples the lever 62-A to a first end 76-A of the support member 60, and the lever spring 70-A (e.g., a torsion spring element) biases the lever 62-A to an extended orientation in which the lever 62-A is substantially perpendicular to the support member 60 and to the outer edge 46 of the circuit board 38 (see FIG. 1). Similarly, the lever hinge 64-B pivotally couples the lever 62-B to a second end 76-B of the support member 60, and the lever spring 70-B biases the lever 62-B to an extended orientation in which the lever 62-B is substantially perpendicular to the support member 60 and to the outer edge 46 of the circuit board 38. As a result, the levers 62 are capable of rotating about the lever hinges 64 between the extended orientations, and collapsed orientations in which the levers 64 are substantially parallel to (or flush with) the support member 60 and the outer edge 46 of the circuit board 38.

Additionally, when the insertion delay subassembly 42 is assembled, the latch hinge 68-A pivotally couples a locking portion of the lever latch 66-A to the lever 62-A. Similarly, the latch hinge 68-B pivotally couples a locking portion of the lever latch 66-B to the lever 62-B. Thus, the locking portions of the lever latches 66 are capable of rotating about the latch hinges 68 relative to the lever 62 to which it is coupled to lock the levers 62 to and unlock the levers 62 from the support member 60. In one arrangement, a special tool is required to actuate the lever latches 66 to unlock the levers 62 from the support member 60. Lever components which are suitable for use as the levers 62 and the lever latches 66 are disclosed in U.S. Pat. No. 6,185,106, which is entitled "PRINTED CIRCUIT BOARD EXTRACTOR TOOL OPERATED LATCH" and which is assigned to the same Assignee as the present invention, the teachings of which are hereby incorporated by reference in their entirety.

In one arrangement, each lever latch 66 further includes an extracting portion having a tabbed end that facilitates installation of the circuit board assembly 24 as the user rotates the levers 62. In this arrangement, the hinges 64, 68 hold the extracting portions of the lever latches 66 to the levers 62. During operation, the tabbed ends hook into channels of the card cage 26 to push the circuit board 38 further into the card cage 26 and to push the circuit board connectors 40 into the backplane connectors 32. In another arrangement, the levers 62 define tabbed ends themselves thus alleviating the need for the extracting portions.

Still with reference to FIG. 2, the insertion delay latch 72 couples to the lever 62-A and the lever latch 66-A. In particular, the latch hinge 68-A captures the insertion delay latch 72 so that the insertion delay latch 72 pivotally couples to the lever 62-A in a manner similar to the above-described locking portion of the lever latch 66-A. Accordingly, the insertion delay latch is capable of rotating about the latch hinge 68-A relative to the lever 62-A. As will be explained in further detail later, the insertion delay latch 72 selectively permits and prevents rotation of the lever 62-A between its extended and collapsed orientation. As a result, a user of the circuit board assembly 24 must actuate the insertion delay latch 72 in order to rotate the lever 62-A to complete installation of the circuit board assembly 24 within the interconnection subsystem 22. The process of actuating the insertion delay latch 72 enables installation of the circuit board assembly 24 to occur in a staggered manner thus providing time for the circuit board assembly 24 to properly align within the card cage 26 (e.g., for proper connector alignment) and for the circuitry 50, if needed, to (i) receive primary power signals, (ii) perform a startup sequence, and (iii) receive other signals after the start up sequence is complete in order to avoid damage and/or begin operation in a proper state.

It should be understood that a spring biases the insertion delay latch 72 at a particular angle relative to the lever 62-A in order to prevent the lever 62-A from easily rotating about the lever hinge 64-A while the insertion delay latch 72 is biased at the particular angle. In some arrangements, the insertion delay subassembly 42 includes a separate spring that installs between the lever 62-A and the insertion delay latch 72 to bias the insertion delay latch 72 to the particular angle relative to the lever 62-A. In one arrangement, the spring is a circular compression spring that is held in place between the lever 62-A and the insertion delay latches 72 (e.g., that fits coaxially around the latch hinge 68-A as shown in FIG. 2, that fits between dimples of the lever 62-A and the insertion delay latches 72, etc.). In another arrangement, the spring is a leaf spring that attaches to either the insertion delay latch 72 or the lever 62-A.

It should be further understood that, by way of example only, the insertion delay subassembly 42 includes a single insertion delay latch 72 that controls the operation of the lever 62-A. In another arrangement of the invention, the insertion delay subassembly 42 includes multiple insertion delay latches 72 so that another insertion delay latch 72 controls the operation of the lever 62-B as well. Further details of the invention will now be provided with reference to FIG. 3.

Figure 3:
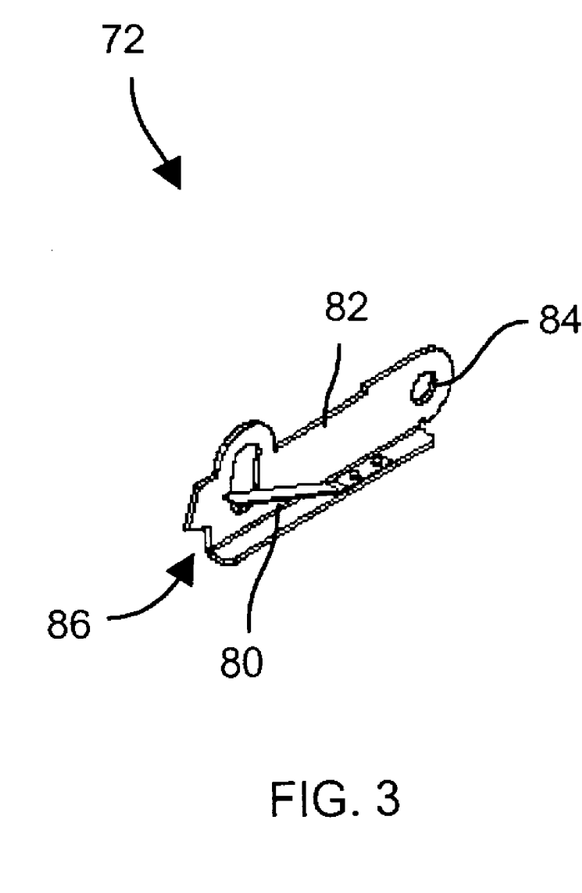
FIG. 3 is a perspective view of an insertion delay latch of the insertion delay subassembly of FIG. 2.

FIG. 3 is a detailed perspective view of the insertion delay latch 72. By way of example only, the insertion delay latch 72 includes a built-in leaf spring 80 which is configured to bias the insertion delay latch 72 relative to the lever 62-A when the insertion delay latch 72 is assembled with the lever 62-A. As explained earlier, it should be understood that alternative spring arrangements are suitable for use by the invention as well.

As shown in FIG. 3, the insertion delay latch 72 includes a main body 82 that defines a hole 84 and an interference surface 86. The leaf spring 80 is coupled at one end to the main body 82. In one arrangement, the insertion delay latch 72 is a solid, contiguous (i.e., unitary) member of resilient material (e.g., metal) which is cut and bent into the main body 82 and the leaf spring 80. In another arrangement, the main body 82 and the leaf spring 80 are separate members (FIG. 3) which are fastened together (e.g., using welds, using epoxy, using rivets, etc.).

When the insertion delay latch 72 is installed within the insertion delay subassembly 42 and when the insertion delay subassembly 42 is ready for installation into the interconnection subsystem 22 (FIGS. 1 and 2), the latch hinge 68-A passes through the hole 84 defined by the main body 82 and holes of the lever 62-A to enable the insertion delay latch 72 to pivot between a first angle and a second angle relative to the lever 62-A. When the insertion delay latch 72 is at the first angle relative to the lever 62-A, the interference surface 86 of the main body 82 interferes with or makes blocking contact with the support member 60 (FIG. 2) to prevent the lever 62-A from rotating from its extended position to a collapsed position against the support member 60 (i.e., to block substantial rotational movement of the lever 62 relative to the support member 60). However, when the insertion delay latch 72 is at the second angle relative to the lever 62-A, the interference surface 86 clears the support member 60 thus allowing the lever 62-A to rotate from its extended position to the collapsed position, and thus enable a user to close the lever 62-A against the support member 60 and complete installation of the circuit board assembly 24. The leaf spring 80 provides a repelling force against the lever 62-A to bias the insertion delay latch 72 at the first angle to prevent complete installation of the circuit board assembly 24 unless the user compresses the insertion delay latch 72 against the lever 62-A. Further details of the invention will now be provided with reference to FIGS. 4–8.

Figure 4:
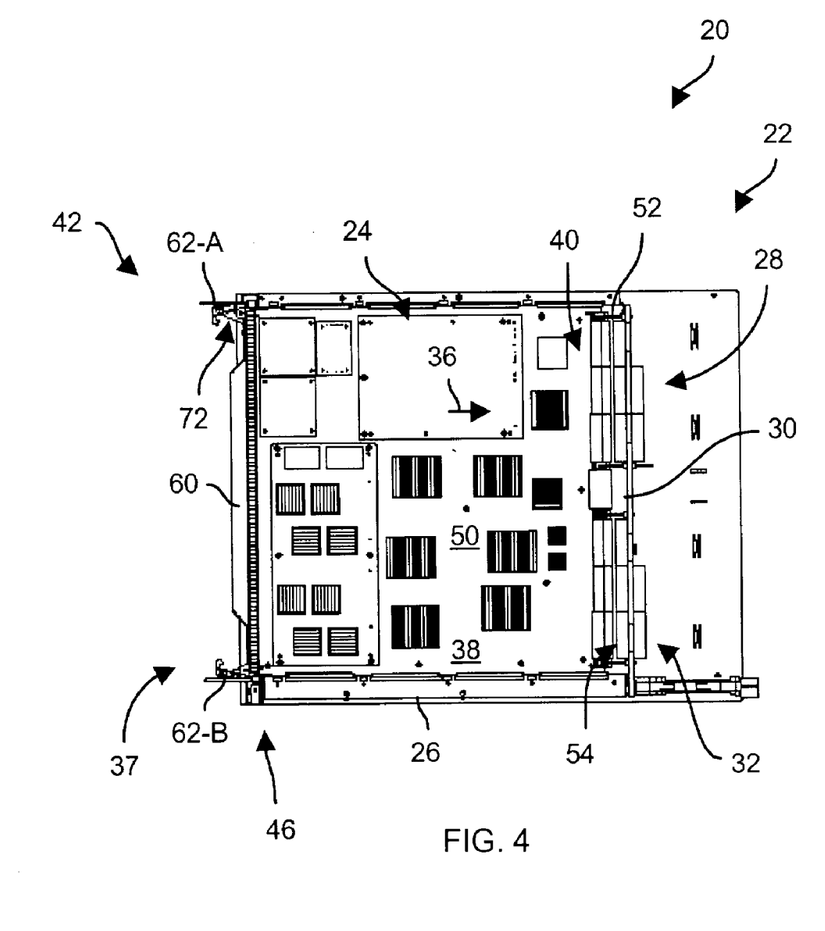
FIG. 4 is a side view of the connection system of FIG. 1 in a partially installed state.

FIGS. 4–8 illustrate the connection system 20 at various stages of the installation process for a circuit board assembly 24. In particular, FIG. 4 shows the connection system 20 after a user has partially inserted the circuit board assembly 24 through the card cage opening 37 and into the cavity 34 of the card cage 26 in the direction 36 (also see FIG. 1). Initially, the levers 62-A, 62-B of the insertion delay subassembly 42 are in their extended orientations. That is, each lever 62-A, 62-B is substantially perpendicular to the support member 60 and the outer edge 46 of the circuit board 38, as well as to the card cage 26.

At this point, the circuit board connectors 40 of the circuit board assembly 24 partially connect with the backplane connectors 32 of the interconnection subsystem 22. In particular, the primary power signal pins 52 which are longer than the other pins 54 of the backplane connectors 32, engage contacts of the circuit board connectors 40 while the other pins 54 remain unconnected with the circuit board connectors 40. Accordingly, if the backplane 30 is powered up (e.g., if other circuit board assemblies 24 are currently in operation), the circuitry 50 of the circuit board 38 of the circuit board assembly 24 undergoing installation receives primary power signals through the primary power signal pins 52 but not other signals. As a result, the circuitry 50 is capable of performing a power-up sequence without any interference from the other signals (e.g., without receiving other power signals, control signals, data signals, etc.).

Figure 5:
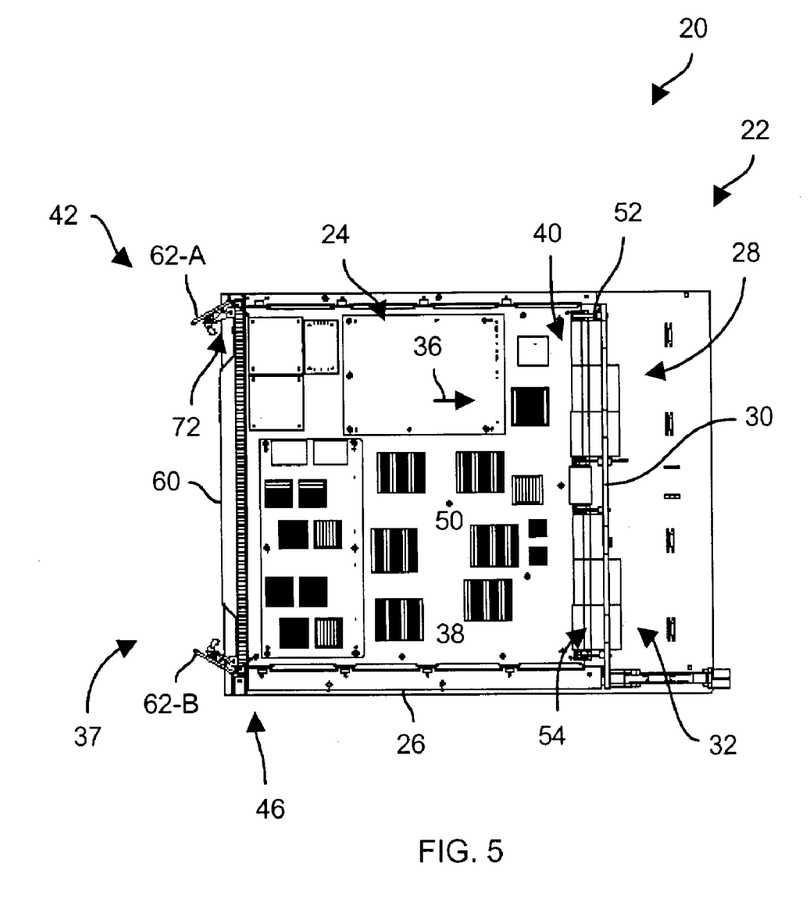
FIG. 5 is a side view of the connection system of FIG. 1 in another partially installed state.

FIG. 5 shows the connection system 20 after the user has further inserted the circuit board assembly 24 into the cavity 34 of the card cage 26 in the direction 36. At this point, the levers 62-A, 62-B of the insertion delay subassembly 42 make contact with the card cage 26 at the opening 37 and partially rotate in response to that contact. However, the insertion delay latch 72 prevents the lever 62-A from substantially rotating from its extended orientation to its collapsed orientations. Rather, the insertion delay latch 72 holds the levers 62-A substantially in its extended orientation and, as a result, the lever 62-A provides interference with the card cage 26 blocking the user from further inserting the circuit board assembly 24 into the card cage 26.

It should be understood that, as shown in FIG. 5, the primary power signal pins 52 of the backplane connectors 32 continue connecting with the circuit board connectors 40. Furthermore, the other shorter pins 54 of the backplane connector 32 still do not reach the circuit board connectors 40 and thus, if backplane 28 is powered up, do not convey any signals (e.g., other power signals, control signals, data signals, etc.) to the circuitry 50 of the circuit board 38 that could otherwise damage or cause improper operation of the circuitry 50.

It should be further understood that, due to interference by the non-closed lever 62-A, the user cannot completely connect the connectors 32, 40 electrically in a single, contiguous motion. Rather, when the non-closed lever 62-A contacts the card cage 26 to block further insertion of the circuit board assembly 24, the circuit board assembly 24 has time to settle within the card cage 26 (e.g., if the top and bottom edges of the circuit board 38 are not properly seated already, they have an opportunity to seat properly within a slot of the card cage 26) in order to properly align the remaining unconnected contacts of the connectors 32, 40. In some arrangements which do not use longer pins 52 for primary power signals (i.e., in arrangements that use pins of only a single length), all of the contacts have an opportunity to align properly. Accordingly, during the final stages of installation, the likelihood of damaging a component due to improper alignment (e.g., bending a pin, cracking a connector, etc.) is minimized or even eliminated.

Figure 6:
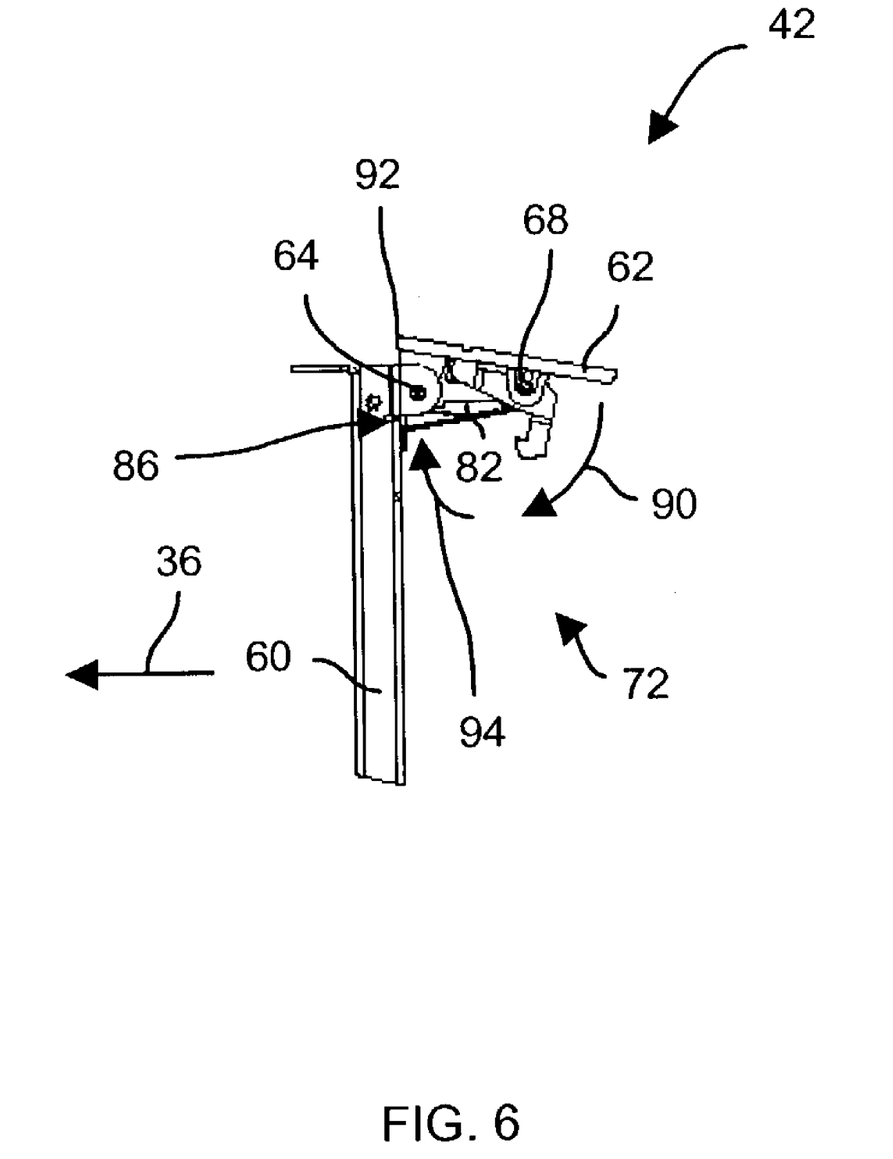
FIG. 6 is a detailed view of a portion of the insertion delay subassembly while the connection system is in the partially installed state of FIG. 5.

FIG. 6 shows a detailed opposite side view of a portion of the insertion delay subassembly 42 while the circuit board assembly 22 is partially within the card cage 26 as shown in FIG. 5. Here, the insertion delay latch 72 is at a first angle relative to the lever 62 (e.g., due to biasing of the spring 80). Thus, the interference surface 86 (FIG. 3) defined by the main body 82 of the insertion delay latch 72 contacts and blocks substantial movement of the lever 62-A in the direction 90. Accordingly, the lever 62-A remains substantially open in the extended orientation (i.e., substantially perpendicular) relative to the support member 60, the edge 46 of the circuit board 38 and the card cage 26. As a result, an end 92 of the lever 62-A provides interference against the card cage 26 (also see FIG. 5) to prevent the circuit board assembly 24 from inserting deeper into the card cage 26.

To complete installation of the circuit board assembly 24 into the interconnection system 22, the user manually actuates the insertion delay latch 72. In particular, the user squeezes the insertion delay latches 72 toward the lever 62-A so that the insertion delay latch 72 moves from the first angle relative to the lever 62-A to a second angle (see the arrow 94 in FIG. 6). While the insertion delay latch 72 is at this second angle, the interference surface 86 of the insertion delay latch 72 no longer blocks rotation of the lever 62-A relative to the support member 60. Rather, the user is now capable of pivoting the lever 62-A in the direction 90 toward the support member 60. In particular, the insertion delay latch 72 is capable of passing through a notch or slot defined by the support member 60 while the insertion delay latch 72 is at the second angle relative to the lever 62-A.

At this point, the user rotates both levers 62 toward the support member 60. In response, a tabbed end of an extraction portion of each lever latch 66 (or a tabbed end of each lever 62) grabs the card cage 26 while ends 92 of the levers 62 steer clear of the card cage 26. The grabbing action of the lever 62 (i.e., the tabbed ends) leverages the circuit board assembly 24 further into the card cage 26. As will now be further explained with reference to FIG. 7, the time required for the user to actuate the insertion delay latch 72 and then move the levers 62 enables the circuit board assembly 24 to properly align within the card cage 26 and permits completion of any power-up sequence of the circuitry 50 of the circuit board assembly 24 prior to receipt of signals other than the primary power signals.

Figure 7:
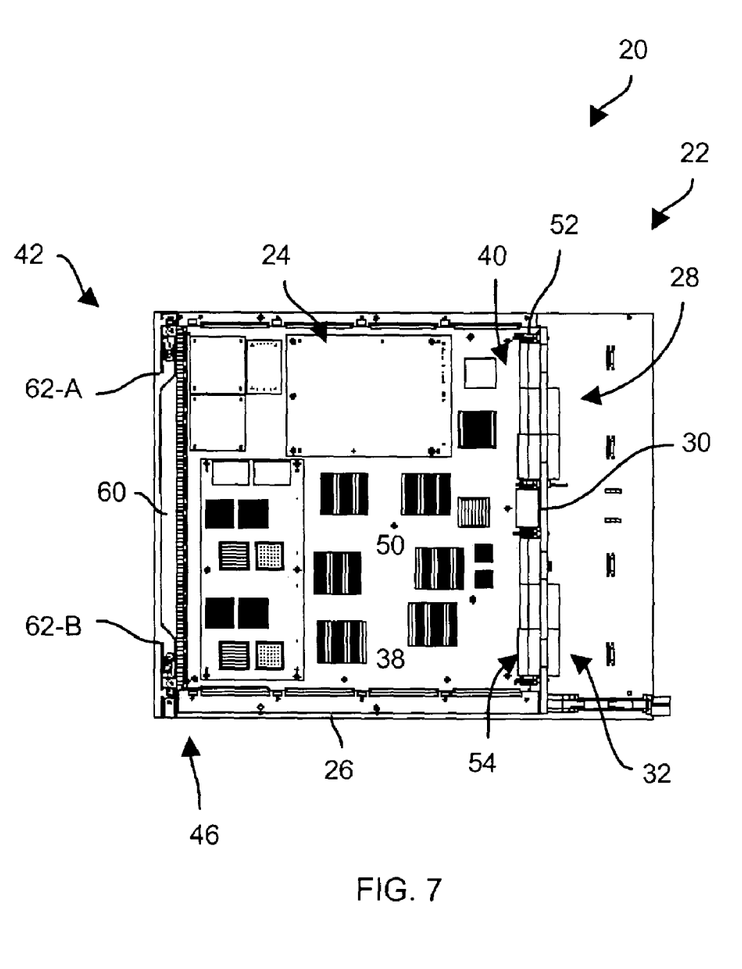
FIG. 7 is a side view of the connection system of FIG. 1 in a fully installed state.

FIG. 7 shows the circuit board assembly 24 in the completely installed position after the user has actuated the insertion delay latch 72 and rotated the levers 62-A, 62-B to leverage the circuit board assembly 24 further into the card cage 26. At this point, the levers 62-A, 62-B are closed against the support member 60 at their collapsed orientations. That is, the levers 62-A, 62-B are now substantially parallel to the support member 60 and the edge 46 of the circuit board 38, and are flush with the opening 37 of the card cage 26. It should be understood that circuit board assembly 24 had time to seat properly since the insertion delay latch 72 prevented the user from installing the circuit board assembly 24 in a single, contiguous motion. This reason plus the user's actuation of the levers 62-A, 62-B simultaneously to evenly move the circuit board assembly 24 within the card cage 26 enables the connectors 32, 40 to properly mate little or no risk of damage, even under situations of tolerance buildup. In particular, as the levers 62-A, 62-B rotate toward the support member 60, leverage from such rotation provides enough insert force to overcome resistance generated by the connectors 32, 40 thus fully mating the connectors 32, 40 so that both the pins 52 and 54 now fully connect with each other.

If the backplane 30 is powered up, the remaining other pins 54 of the backplane connectors 32 connect with corresponding contacts in the circuit board connectors 40 so that the circuitry 50 of the circuit board assembly 24 now receives other signals in addition to the primary power signals (e.g., other power signals, control signals, data signals, etc.) through the pins 54 and begins normal operation.

Figure 8:
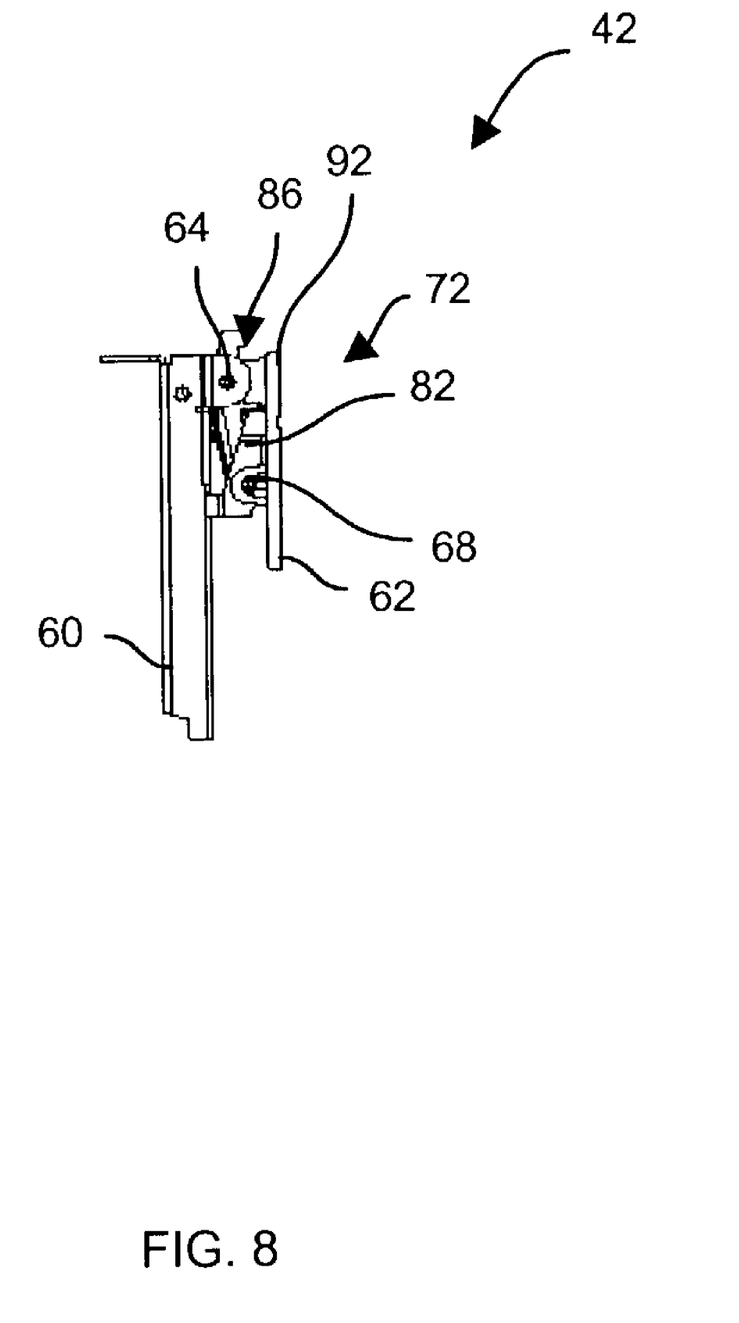
FIG. 8 is a detailed view of the portion of the insertion delay subassembly of FIG. 6 while the connection system is in the fully installed state.

FIG. 8 shows the portion of the insertion delay subassembly 42 of FIG. 6 while the connection system 20 is in the fully installed state. As shown, the end 92 of the lever 62 is no longer in an obstructing position to block further insertion of the circuit board assembly 24 within the card cage 26 (also see FIG. 7). Rather, the lever 62 is now collapsed against the support member 60 and the circuit board assembly 24 thus enabling full installation of the circuit board assembly 24 so that the circuit board assembly now sits in a completely installed position within the interconnection subsystem 22 (FIG. 7).

It should be understood that the insertion delay subassembly 42 enables removal of the circuit board assembly 24 from the interconnection subsystem 22 when the user operates the levers 62 in a reverse manner. That is, when the user pivots the levers 62 away from the support member 60, the levers 62 push off of the card cage 26 to provide enough extraction force to un-connect the connectors 32, 40 and thus remove the circuit board assembly 24 from the interconnection subsystem 22, e.g., during a "hot swapping" procedure in which remaining circuit board assemblies 24 and the backplane 30 remain powered up and in operation.

Figure 9:
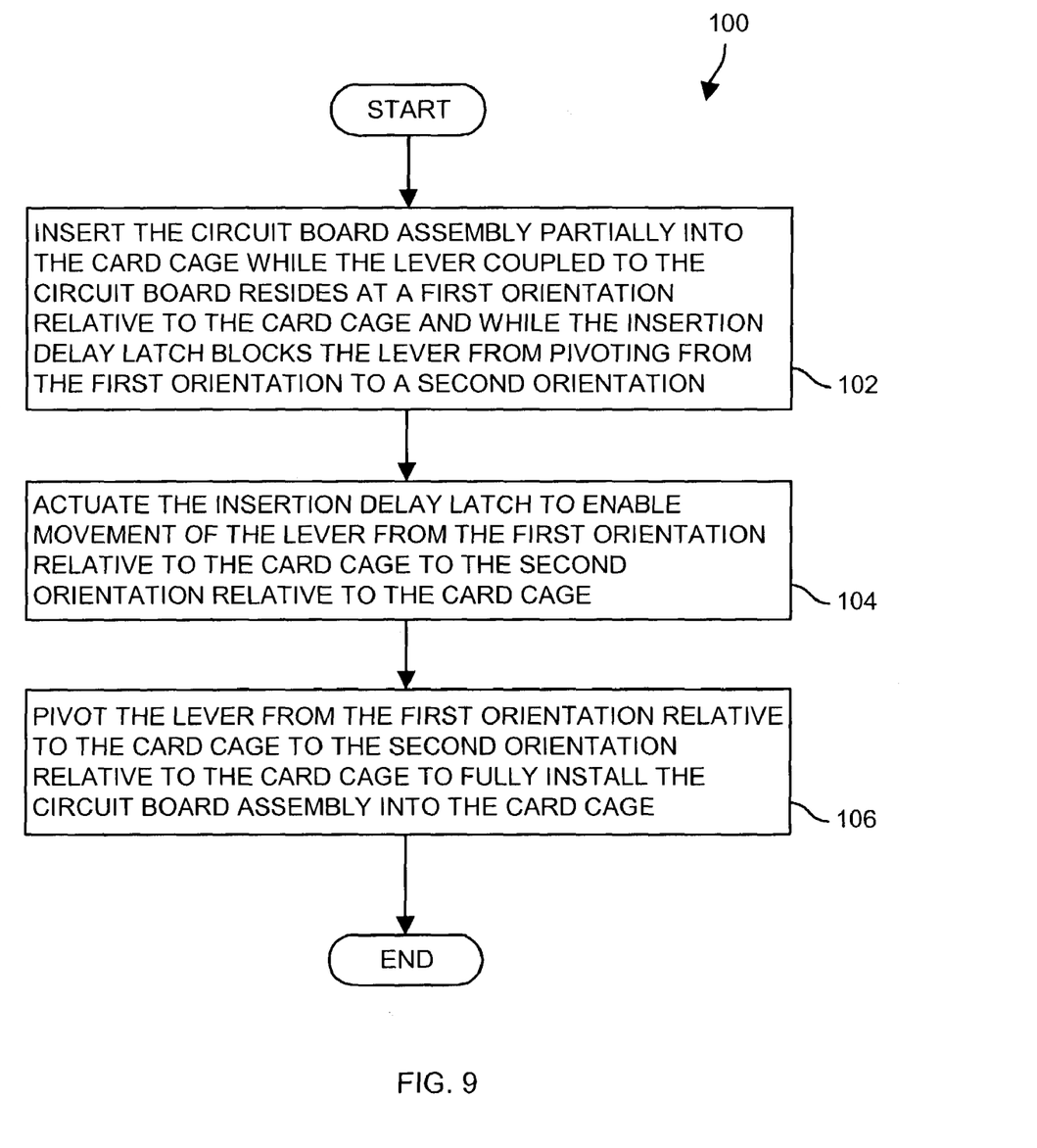
FIG. 9 is a flowchart of a procedure which is performed by a user of the connection system of FIG. 1.

FIG. 9 is a flowchart of a procedure 100 which is performed by a user of the connection system 20 of FIG. 1. This procedure 100 summarizes the steps that a user takes when installing the circuit board assembly 24 into the interconnection assembly 22.

In step 102, the user inserts the circuit board assembly 24 partially into the card cage 26. Here, the levers 62-A, 62-B, which are coupled to the circuit board 38 through the support member 60, reside at extended orientations relative to the support member 60 and the card cage 26 while the insertion delay latch 72 blocks the lever 62-A from pivoting from its extended orientation to its collapsed orientation (also see FIGS. 5 and 6).

In step 104, the user actuates the insertion delay latch 72 to enable movement of the lever 62-A from its extended orientation relative to support member 60 and the card cage 26, to its collapsed orientation relative to support member 60 and the card cage 26. In particular, the user manually compresses the insertion delay latch 72 against the lever 62-A. That is, the user pivots the insertion delay latch 72 relative to the lever 62-A such that the insertion delay latch 72 clears a portion of the support member 60 to enable movement of the lever 62-A from its extended orientation to its collapsed orientation.

In step 106, the user pivots the levers 62-A, 62-B from their extended orientations relative to the card cage 26 to their extended orientations relative to the card cage 26 to fully install the circuit board assembly 24 into the card cage 26 (also see FIGS. 7 and 8). Here, tabbed ends of the lever latches 66 (or of the levers 62-A, 62-B) grab the card cage 26 to enable the insertion delay subassembly 42 to evenly guide the circuit board assembly 24 further into the card cage 26 so that the connectors 32, 40 completely connect with each other.

It should be understood that the procedure 100 enables the user to install the circuit board assembly 24 into the interconnection subsystem 22 in a staggered or multi-staged manner so that the connectors 32, 40 mate slowly and evenly. Such a delivery scheme allows the circuit board connectors 32 to properly align with the backplane connectors 40 prior to connector engagement thus reducing the risk of damaging a component (e.g., bending a connector pin, or overstressing a connector or the circuit board, fracturing a solder joint, etc.). In particular, the time required for the user to perform steps 104 and 106 enables (i) the circuit board assembly 24 to properly seat within the card cage 26 and (ii) any power-up sequence to complete prior to fully connecting the connectors 32, 40. As a result, installation of the circuit board assembly 24 tends to occur with proper alignment and avoids damaging the circuitry 50 and interconnection components (e.g., the connectors 32, 40).

As described above, the invention is directed to circuit board installation techniques which utilize an insertion delay latch 72. Use of the insertion delay latch 72 enables a user to connect a circuit board 38 to another structure (e.g., the backplane 30, a motherboard, etc.) in a staggered, but simple and deliberate manner. Accordingly, the insertion delay latch 72 provides time for proper component alignment, and is well-suited for use in "hot swapping" situations that require or prefer that a first set of connector contacts (e.g., primary power signal pins) to electrically connect before a second set of connector contacts (e.g., non-primary power signal pins, control signal pins, data signal pins, etc.).

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the longer pins 52 were described above as being configured to carry primary power signals and the other shorter pins 54 were described above as being configured to carry signals other than the primary power signals by way of example only. In other arrangements, there is a different pin configuration for the pins (e.g., power and control signals through the longer pins 52, unevenly distributed longer pins 52, a uniform length for all pins 52, 54 so that the pins 52, 54 do not connect at all until the user actuates the insertion delay latch 72 and rotates the levers 62, etc.).

Additionally, it should be understood that the levers 62-A, 62-B were described above as being pivotally connected to the support member 60 of the insertion delay subassembly 42 by way of example only. In other arrangements, the levers 62-A, 62-B are pivotally connected to other components of the connection system 20 such as the circuit board 38 directly, the card cage 26, etc.

Furthermore, it should be understood that the explanation above described only the levers 62-A as being equipped with an insertion delay latch 72. In other arrangements, the insertion delay subassembly includes an insertion delay latch 72 for each lever 62. In this arrangement, the user actuates both insertion delay latches 72 prior to closing the levers 62 against the support member 60. As a result, the insertion delay latches 72 prevent the user from fully installing the circuit board assembly 24 into the interconnection subsystem 22 using a single contiguous motion. Rather, the user actuates the insertion delay latches 72 and then rotates the levers 62 to complete installation thus providing time for the circuit board assembly 24 to properly align within the card cage 26 and for any power-up sequence to complete.

Additionally, it should be understood that, in some arrangements, the spring 80 is unnecessary. For example, in the above-described arrangement which uses only one insertion delay latch 72 for the top lever 62-A, gravitational force is suitable for biasing the insertion delay latch 72 to the first angle when the insertion delay subassembly 42 resides in a vertical position (e.g., see FIG. 4). Accordingly, the user actuates the insertion delay latch 72 to the second angle by overcoming the gravitational force on the insertion delay latch 72 to rotate the lever 62-A and complete installation of the circuit board assembly 24.

Furthermore, it should be understood that the insertion delay latch 72 is suitable for use on assemblies that use more or less than two levers 62. In some arrangements, each circuit board assemblies 24 uses a single lever 62 and the connectors 32, 40 do not require high insertion force (e.g., low insertion force, zero insertion force, etc.). In such arrangements, the insertion delay latch 72 is still useful since it enables installation to occur in a multi-staged manner.

I claim:

1. A connection system, comprising:
    a card cage;
    a set of card cage connectors coupled to the card cage; and
    a circuit board assembly including:
    (A) a circuit board which is configured to install into the card cage;
    (B) a set of circuit board connectors mounted to the circuit board, the set of circuit board connectors being configured to electrically connect with the set of card cage connectors; and (C) an insertion delay subassembly having:
  a support member which mounts to the circuit board;
  a lever coupled to the support member, the lever being configured to reside in a first orientation relative to the support member when the circuit board initially engages with the card cage and when the set of circuit board connectors partially electrically connect with the set of card cage connectors, and pivot from the first orientation to a second orientation relative to the support member when the circuit board subsequently installs fully within the card cage and when the set of circuit board connectors fully electrically connect with the set of card cage connectors;
  an insertion delay latch coupled to one of the support member and the lever, the insertion delay latch being configured to selectively (i) block movement of the lever from the first orientation to the second orientation, and (ii) enable movement of the lever from the first orientation to the second orientation; and
  a spring disposed between the lever and the insertion delay latch, the spring providing a force that biases the insertion delay latch at a first angle relative to the lever;
wherein the insertion delay latch pivotally couples to the lever, wherein the insertion delay latch is configured to (i) interfere with a portion of the support member when the insertion delay latch resides at the first angle relative to the lever to block movement of the lever from the first orientation to the second orientation, and (ii) clear the portion of the support member when the insertion delay latch resides at a second angle relative to the lever to enable movement of the lever from the first orientation to the second orientation.

2. The circuit board assembly of claim 1 wherein the insertion delay latch is configured to reside (i) at the first angle relative to the lever in response to gravitational force on the insertion delay latch, and (ii) at the second angle relative to the lever in response to a force that overcomes the gravitational force on the insertion delay latch.

3. The circuit board assembly of claim 1 wherein the spring is a leaf spring member that attaches to the insertion delay latch.

4. The connection system of claim 1 wherein the insertion delay subassembly further includes:
  a rod-shaped latch hinge which captures a first end of the insertion delay latch to the lever and enables a second end of the insertion delay latch to rotate relative to the lever about the rod-shaped latch hinge.

5. The connection system of claim 4 wherein the second end of the insertion delay latch is adapted to swing away from the lever about the rod-shaped latch hinge in a substantially frictionless manner in response to gravitational force on the insertion delay latch.

6. The connection system of claim 4 wherein the spring is a leaf spring which is made of a substantially same metallic material as that of the insertion delay latch.

7. A circuit board assembly, comprising:
  a circuit board which is configured to install into a card cage;
  a set of circuit board connectors mounted to the circuit board, the set of circuit board connectors being configured to electrically connect with a set of card cage connectors within the card cage; and
  an insertion delay subassembly having:
    a support member which mounts to the circuit board;
    a lever coupled to the support member, the lever being configured to reside in a first orientation relative to the support member when the circuit board initially engages with the card cage and when the set of circuit board connectors partially electrically connect with the set of card cage connectors, and pivot from the first orientation to a second orientation relative to the support member when the circuit board subsequently installs fully within the card cage and when the set of circuit board connectors fully electrically connect with the set of card cage connectors;
    an insertion delay latch coupled to one of the support member and the lever, the insertion delay latch being configured to selectively (i) block movement of the lever from the first orientation to the second orientation, and (ii) enable movement of the lever from the first orientation to the second orientation;
    a spring disposed between the lever and the insertion delay latch, the spring providing a force that biases the insertion delay latch at a first angle relative to the lever;
  wherein the insertion delay latch pivotally couples to the lever, wherein the insertion delay latch is configured to (i) interfere with a portion of the support member when the insertion delay latch resides at the first angle relative to the lever to block movement of the lever from the first orientation to the second orientation, and (ii) clear the portion of the support member when the insertion delay latch resides at a second angle relative to the lever to enable movement of the lever from the first orientation to the second orientation.

8. The circuit board assembly of claim 7 wherein the insertion delay subassembly further includes:
  a rod-shaped latch hinge which captures a first end of the insertion delay latch to the lever and enables a second end of the insertion delay latch to rotate relative to the lever about the rod-shaped latch hinge.

9. The circuit board assembly of claim 8 wherein the second end of the insertion delay latch is adapted to swing away from the lever about the rod-shaped latch hinge in a substantially frictionless manner in response to gravitational force on the insertion delay latch.

10. The circuit board assembly of claim 8 wherein the spring is a leaf spring which is made of a substantially same metallic material as that of the insertion delay latch.

11. An insertion delay subassembly for a circuit board, comprising:
  a support member which is configured to mount to the circuit board;
  a lever coupled to the support member, the lever being configured to reside in a first orientation relative to the support member when the circuit board initially engages with a card cage, and pivot from the first orientation to a second orientation relative to the support member when the circuit board subsequently installs fully within the card cage;
  an insertion delay latch coupled to one of the support member and the lever, the insertion delay latch being configured to selectively (i) block movement of the lever from the first orientation to the second orientation, and (ii) enable movement of the lever from the first orientation to the second orientation;

a spring disposed between the lever and the insertion delay latch, the spring providing a force that biases the insertion delay latch at a first angle relative to the lever; and wherein the insertion delay latch pivotally couples to the lever, wherein the insertion delay latch is configured to (i) interfere with a portion of the support member when the insertion delay latch resides at the first angle relative to the lever to block movement of the lever from the first orientation to the second orientation, and (ii) clear the portion of the support member when the insertion delay latch resides at a second angle relative to the lever to enable movement of the lever from the first orientation to the second orientation.

12. The insertion delay subassembly of claim 11 wherein the insertion delay latch is configured to reside (i) at the first angle relative to the lever in response to gravitational force on the insertion delay latch, and (ii) at the second angle relative to the lever in response to a force that overcomes the gravitational force on the insertion delay latch.

13. The insertion delay subassembly of claim 11 wherein the spring is a leaf spring member that attaches to the insertion delay latch.

14. The insertion delay subassembly of claim 11, further comprising:
a rod-shaped latch hinge which captures a first end of the insertion delay latch to the lever and enables a second end of the insertion delay latch to rotate relative to the lever about the rod-shaped latch hinge.

15. The insertion delay subassembly of claim 14 wherein the second end of the insertion delay latch is adapted to swing away from the lever about the rod-shaped latch hinge in a substantially frictionless manner in response to gravitational force on the insertion delay latch.

16. The insertion delay subassembly of claim 14 wherein the spring is a leaf spring which is made of a substantially same metallic material as that of the insertion delay latch.

17. A method for connecting a circuit board assembly to a set of card cage connectors, the method comprising:
inserting the circuit board assembly partially into a card cage while a lever coupled to the circuit board resides at a first orientation relative to the card cage and while an insertion delay latch blocks the lever from pivoting from the first orientation to a second orientation;
actuating the insertion delay latch to enable movement of the lever from the first orientation relative to the card cage to the second orientation relative to the card cage, actuation of the insertion delay latch compressing a spring disposed between the lever and the insertion delay latch, the spring providing a force that biases the insertion delay latch at a first angle relative to the lever, the insertion delay latch pivotally coupling to the lever, the insertion delay latch being configured to (i) interfere with a portion of the support member when the insertion delay latch resides at the first angle relative to the lever to block movement of the lever from the first orientation to the second orientation, and (ii) clear the portion of the support member when the insertion delay latch resides at a second angle relative to the lever to enable movement of the lever from the first orientation to the second orientation; and
pivoting the lever from the first orientation relative to the card cage to the second orientation relative to the card cage to fully install the circuit board assembly into the card cage.

18. The method of claim 17 wherein a rod-shaped latch hinge captures a first end of the insertion delay latch to the lever and enables a second end of the insertion delay latch to rotate relative to the lever about the rod-shaped latch hinge, wherein the second end of the insertion delay latch is adapted to swing away from the lever about the rod-shaped latch hinge in a substantially frictionless manner in response to gravitational force on the insertion delay latch, and wherein the spring is a leaf spring which is made of a substantially same metallic material as that of the insertion delay latch.

19. A circuit board assembly, comprising:
a circuit board which is configured to install into a card cage;
a set of circuit board connectors mounted to the circuit board, the set of circuit board connectors being configured to electrically connect with a set of card cage connectors within the card cage; and
an insertion delay subassembly having:
a support member which mounts to the circuit board;
a lever coupled to the support member, the lever being configured to reside in a first orientation relative to the support member when the circuit board initially engages with the card cage and when the set of circuit board connectors partially electrically connect with the set of card cage connectors, and pivot from the first orientation to a second orientation relative to the support member when the circuit board subsequently installs fully within the card cage and when the set of circuit board connectors fully electrically connect with the set of card cage connectors;
blocking means for selectively blocking movement of the lever from the first orientation to the second orientation, and enabling movement of the lever from the first orientation to the second orientation; and
a spring disposed between the lever and the blocking means, the spring providing a force that biases the blocking means at a first angle relative to the lever;
wherein the blocking means couples to the lever, wherein the blocking means is configured to (i) interfere with a portion of the support member when the blocking means resides at the first angle relative to the lever to block movement of the lever from the first orientation to the second orientation, and (ii) clear the portion of the support member when the blocking means resides at a second angle relative to the lever to enable movement of the lever from the first orientation to the second orientation.

20. The circuit board assembly of claim 19 wherein the insertion delay subassembly further includes a rod-shaped latch hinge which captures a first end of the insertion delay latch to the lever and enables a second end of the insertion delay latch to rotate relative to the lever about the rod-shaped latch hinge, wherein the second end of the insertion delay latch is adapted to swing away from the lever about the rod-shaped latch hinge in a substantially frictionless manner in response to gravitational force on the insertion delay latch, and wherein the spring is a leaf spring which is made of a substantially same metallic material as that of the insertion delay latch.

21. An insertion delay subassembly for a circuit board, comprising:

a support member which is configured to mount to the circuit board;

a lever coupled to the support member, the lever being configured to reside in a first orientation relative to the support member when the circuit board initially engages with a card cage, and pivot from the first orientation to a second orientation relative to the support member when the circuit board subsequently installs fully within the card cage; and blocking means for selectively blocking movement of the lever from the first orientation to the second orientation, and enabling movement of the lever from the first orientation to the second orientation; and a spring disposed between the lever and the blocking means, the spring providing a force that biases the blocking means at a first angle relative to the lever; and wherein the blocking means pivotally couples to the lever, wherein the blocking means is configured to (i) interfere with a portion of the support member when the blocking means resides at the first angle relative to the lever to block movement of the lever from the first orientation to the second orientation, and (ii) clear the portion of the support member when the blocking means resides at a second angle relative to the lever to enable movement of the lever from the first orientation to the second orientation.

22. The insertion delay subassembly of claim 21, further comprising:

a rod-shaped latch hinge which captures a first end of the insertion delay latch to the lever and enables a second end of the insertion delay latch to rotate relative to the lever about the rod-shaped latch hinge, wherein the second end of the insertion delay latch is adapted to swing away from the lever about the rod-shaped latch hinge in a substantially frictionless manner in response to gravitational force on the insertion delay latch, and wherein the spring is a leaf spring which is made of a substantially same metallic material as that of the insertion delay latch.

* * * * *